US011222566B2

(12) United States Patent
Fu et al.

(10) Patent No.: US 11,222,566 B2
(45) Date of Patent: Jan. 11, 2022

(54) SHIFT REGISTER CIRCUIT, SCAN DRIVING CIRCUIT, DISPLAY DEVICE AND METHOD FOR DRIVING SCAN DRIVING CIRCUIT

(71) Applicants: BOE Technology Group Co., Ltd., Beijing (CN); Ordos Yuansheng Optoelectronics Co., Ltd., Inner Mongolia (CN)

(72) Inventors: Yishan Fu, Beijing (CN); Jun Fan, Beijing (CN); Fuqiang Li, Beijing (CN); Jiguo Wang, Beijing (CN); Yue Shan, Beijing (CN); Taiyang Liu, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 150 days.

(21) Appl. No.: 16/145,396

(22) Filed: Sep. 28, 2018

(65) Prior Publication Data
US 2019/0189039 A1 Jun. 20, 2019

(30) Foreign Application Priority Data
Dec. 15, 2017 (CN) .......................... 201711351459.6

(51) Int. Cl.
*G11C 19/00* (2006.01)
*G09G 3/20* (2006.01)
*G11C 19/28* (2006.01)

(52) U.S. Cl.
CPC .............. *G09G 3/20* (2013.01); *G11C 19/28* (2013.01); *G09G 2310/0267* (2013.01);
(Continued)

(58) Field of Classification Search
None
See application file for complete search history.

(56) References Cited

U.S. PATENT DOCUMENTS

| 4,656,368 | A | * | 4/1987 | McCombs | ........... | H03K 3/3562 |
| | | | | | | 326/95 |
| 5,280,203 | A | * | 1/1994 | Hung | ............... | H03K 19/17704 |
| | | | | | | 326/21 |

(Continued)

FOREIGN PATENT DOCUMENTS

| CN | 104269145 A | 1/2015 |
| CN | 104616615 A | 5/2015 |

(Continued)

OTHER PUBLICATIONS

First office action of Chinese application No. 201711351459.6 dated Jan. 16, 2020.

*Primary Examiner* — Tuan T Lam
(74) *Attorney, Agent, or Firm* — Fay Sharpe LLP

(57) ABSTRACT

A shift register circuit, a scan driving circuit, a display device and method for driving the scan driving circuit are provided. The shift register circuit includes: an input circuit for providing an active level for the first node upon receiving the active level of scan trigger signal; a trigger circuit for outputting the active level of scan trigger signal at the second node when first node is at the active level and a first clock signal is at first level; a locking circuit for locking the level of first node as inactive level when a first control signal is at the active level; and an output circuit for outputting a gate turn-on voltage during a period in which the second node is at an active level of the scan trigger signal, and outputting a voltage same as voltage of a second control signal during other periods other than the period.

7 Claims, 12 Drawing Sheets

(52) U.S. Cl.
CPC . *G09G 2310/0286* (2013.01); *G09G 2310/08* (2013.01); *G09G 2320/0252* (2013.01)

(56) References Cited

U.S. PATENT DOCUMENTS

| | | | | |
|---|---|---|---|---|
| 2016/0179258 A1* | 6/2016 | Fan | ............................ | G06F 1/06 345/173 |
| 2016/0365050 A1* | 12/2016 | Qing | ..................... | G09G 3/3677 |
| 2017/0039973 A1 | 2/2017 | Huang | | |
| 2017/0084238 A1* | 3/2017 | Cao | ........................ | G09G 3/3266 |
| 2017/0162148 A1 | 6/2017 | Xiao et al. | | |
| 2017/0169781 A1 | 6/2017 | Chen et al. | | |
| 2017/0193946 A1* | 7/2017 | Huang | .................. | G09G 3/3677 |
| 2017/0358266 A1* | 12/2017 | Zhang | .................. | G09G 3/3677 |
| 2018/0061346 A1* | 3/2018 | Zhao | ..................... | G09G 3/3677 |
| 2018/0190178 A1* | 7/2018 | Hong | .................... | G09G 3/3266 |
| 2018/0218701 A1* | 8/2018 | Yi | ........................ | G09G 3/3677 |
| 2018/0240432 A1* | 8/2018 | Zhao | ..................... | G09G 3/3677 |
| 2018/0301102 A1* | 10/2018 | Yi | ......................... | G09G 3/3696 |
| 2020/0160769 A1* | 5/2020 | Fu | ............................ | G09G 3/20 |

FOREIGN PATENT DOCUMENTS

| | | | |
|---|---|---|---|
| CN | 104700806 | A | 6/2015 |
| CN | 104992662 | * | 10/2015 |
| CN | 104992662 | A | 10/2015 |
| CN | 105118416 | A | 12/2015 |
| CN | 105118466 | A | 12/2015 |
| CN | 107767809 | A | 3/2018 |
| KR | 20170078165 | A | 7/2017 |

\* cited by examiner

SHIFT REGISTER CIRCUIT, SCAN DRIVING CIRCUIT, DISPLAY DEVICE AND METHOD FOR DRIVING SCAN DRIVING CIRCUIT

This application claims priority to Chinese Patent Application No. 201711351459.6, filed on Dec. 15, 2017 and titled "SHIFT REGISTER UNIT, SCAN DRIVING CIRCUIT, DISPLAY DEVICE AND DRIVING METHOD", the disclosure of which is hereby incorporated by reference in its entirety.

TECHNICAL FIELD

The present disclosure relates to a shift register circuit, a scan driving circuit, a display device and a method for driving the scan driving circuit.

BACKGROUND

Compared with the conventional technology, the gate driver on array (GOA) technology can not only save the circuit board carrying a scan driving circuit and realize the symmetric design of both sides of a display panel, but also omit the chip bonding area and the wiring area such as the fan-out area on the edge of the display panel, thereby facilitating the implementation of a narrow border design. Meanwhile, since the GOA technology can omit the chip bonding process in a row direction, it is also greatly beneficial for the overall productivity and yield improvement. In the related GOA design, the scan driving circuit needs to support the XON function, that is, the gate turn-on voltage can be output to the scan lines in all rows under the control of a control signal for completing, for example, the operation of shutdown for clearing screen.

SUMMARY

There is provided a shift register circuit, a scan driving circuit, a display device and a method for driving the scan driving circuit in the present disclosure.

In a first aspect, there is provided a shift register circuit, comprising:

an input circuit connected to a first node and configured to provide, upon receiving an active level of a scan trigger signal, the active level for the first node;

a trigger circuit, connected respectively to the first node and a second node, and configured to provide the active level of the scan trigger signal for the second node when the first node is at the active level and a first clock signal is at a first level;

a locking circuit connected to the first node and configured to lock a level of the first node as an inactive level when a first control signal is at the active level; and an output circuit connected to the second node and configured to output a gate turn-on voltage during a period in which the second node is at an active level of the scan trigger signal, and output a voltage same as a voltage of a second control signal during other periods other than the period.

In an implementation, the output circuit comprises at least two output sub-circuits, the at least two output sub-circuits are both connected to the second node, each of the output sub-circuits is connected to a second clock signal, a duty cycle of the second clock signal is less than a duty cycle of the first clock signal, each of the output sub-circuits is connected to one of the at least two scan output ends, and the output sub-circuit is configured to provide a level same as the level of the second clock signal connected thereto for the scan output end connected thereto during a period in which the second node is at the active level of the scan trigger signal, and provide a voltage same as the voltage of the second control signal for the scan output end connected thereto during other periods other than the period.

In an implementation, the output sub-circuit comprises a first tri-state gate and a second tri-state gate, an input end of the first tri-state gate is connected to the second clock signal corresponding thereto, an output end thereof is connected to the scan output end corresponding thereto, and a control end thereof is connected to the second node, and an input end of the second tri-state gate is connected to the second control signal, an output end thereof is connected to the scan output end corresponding thereto, and a control end thereof is connected to the second node.

In an implementation, the locking circuit comprises a first transistor, a gate electrode of the first transistor is connected to the first control signal, one of a source electrode and a drain electrode thereof is connected to a first voltage line for providing an inactive level of the first node, and the other is connected to the first node.

In an implementation, the input circuit comprises a third tri-state gate and a fourth tri-state gate, an input end of the third tri-state gate is connected to a forward scan input end, an output end thereof is connected to a third node, and a control end thereof is connected to a scan direction control signal, and an input end of the fourth tri-state gate is connected to a reverse scan input end, an output end thereof is connected to the third node, and a control end thereof is connected to the scan direction control signal.

In an implementation, the input circuit further comprises a first NOT gate, an input end of the first NOT gate is connected to the third node, an output end thereof is connected to the first node, and an enabling end thereof is connected to the first clock signal, and the first level of the first clock signal is a level causing the first NOT gate to be in a nonworking state.

In an implementation, the trigger circuit comprises a second NOT gate, a third NOT gate, an NAND gate, and a fourth NOT gate, an input end of the second NOT gate is connected to a first input end of the NAND gate, an output end thereof is connected to the first node, and an enabling end thereof is connected to the first clock signal, the first level of the first clock signal is a high level, and the second NOT gate is in a working state when the enabling end is at a high level, an input end of the third NOT gate is connected to the first node, and an output end thereof is connected to the first input end of the NAND gate, a second input end of the NAND gate is connected to the first clock signal, an output end thereof is connected to an input end of the fourth NOT gate, and an output end of the fourth NOT gate is connected to the second node.

In another aspect, there is provided a scan driving circuit in the present disclosure, which comprises at least one shift register circuit according to any of above shift register circuits.

In another aspect, there is provided a display device in the present disclosure, which comprises any one of the above mentioned scan driving circuits.

In another aspect, there is provided a driving method for a scan driving circuit, wherein the scan driving circuit comprises at least one shift register circuit according to claim 1, and the method comprises:

switching the first control signal to an active level, and switching the second control signal to a gate turn-on voltage, to cause each of the shift register circuits in the scan driving circuit to output the gate turn-on voltage.

DETAILED DESCRIPTION

To make the principles and advantages of the present disclosure clearer, the embodiments of the present disclosure will be described below in detail in conjunction with the accompanying drawings. It is obvious that the described embodiments are part rather than all of the embodiments of the present disclosure. All other embodiments obtained by those of ordinary skill in the art based on the embodiments of the present disclosure without creative work are within the scope of protection of the present disclosure. Unless otherwise defined, technical terms or scientific terms used in the present disclosure shall be of ordinary meaning as understood by those of ordinary skill in the art to which the present disclosure pertains. The term "first" or "second" or a similar term used in the present disclosure does not denote any order, quantity, or importance, but is merely used to distinguish different components. The term "comprising" or a similar term means that elements or items which appear before the term include the elements or items listed after the term and their equivalents, and do not exclude other elements or items. The term "connection" or "connected to" or a similar term is not limited to a physical or mechanical connection but may include an electrical connection that is direct or indirect.

Figure 1:
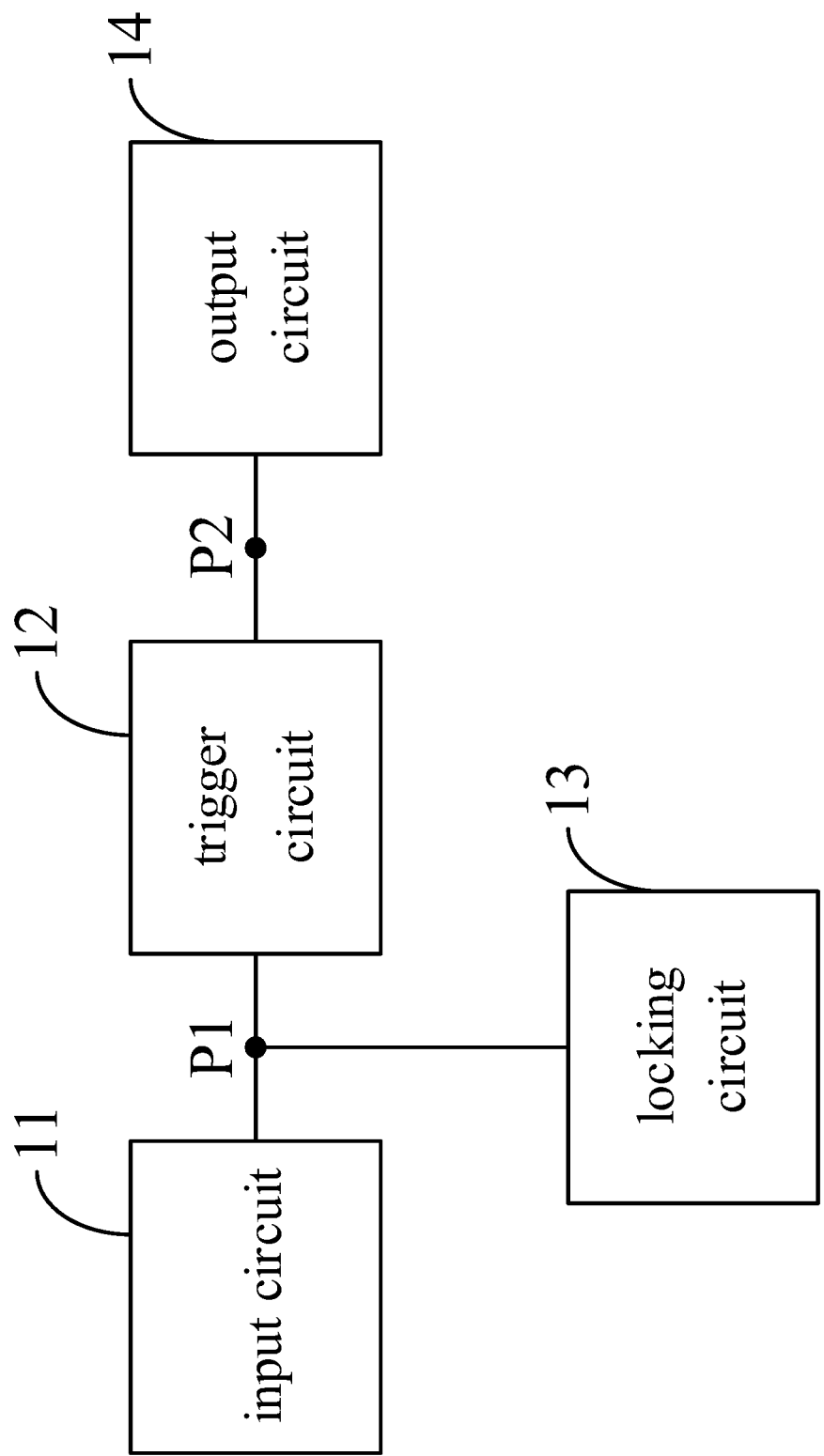
FIG. 1 is a block diagram of a structure of a shift register circuit according to an embodiment of the present disclosure.

FIG. 1 is a block diagram of a structure of a shift register circuit according to an embodiment of the present disclosure. Referring to FIG. 1, the shift register circuit includes:

an input circuit 11, connected to a first node P1 and configured to provide an active level for the first node P1 upon receiving the active level of a scan trigger signal;

a trigger circuit 12, connected respectively to the first node P1 and a second node P2, and configured to provide an active level of the scan trigger signal for the second node P2 when the first node P1 is at the active level and a first clock signal is at a first level;

a locking circuit 13, connected to the first node P1 and configured to lock the level of the first node P1 at an inactive level when a first control signal is at the active level; and an output circuit 14, connected to the second node P2, and configured to output a gate turn-on voltage during a period in which the scan trigger signal of the second node P2 is at an active voltage, and output a voltage same as a voltage of a second control signal during other periods other than the period.

It should be noted that the active level and the inactive level herein refer to two different pre-configured voltage ranges (both based on the common terminal voltage) for specific circuit nodes respectively. In an example, the active levels of all circuit nodes are high levels. In another example, the active levels of all circuit nodes are low levels. In yet another example, the active levels at the scan trigger signal and the second node P2 are low levels, while the active level at the first node P1 is high level. Of course, the setting of active level and inactive level may not only be limited to the above examples.

In an example, the first control signal is always at the inactive level. When the input circuit 11 receives the active level of the scan trigger signal, the first clock signal is at a second level, and at this point, the first node P1 is turned to be at the active level under the action of an input circuit 11. Thereafter, when the first clock signal is turned to be at a first level, a trigger circuit 12 begins to output the active level of the scan trigger signal at the second node P2. Therefore, the shift register circuit can output the active level of the input scan trigger signal after a period of time, that is, can realize the function of the shift register, and thus can be configured to realize the function of outputting the gate turn-on voltage row by row between the plurality of rows of gate lines of the scan driving circuit.

In still another example, the first control signal is at the active level while the second control signal is kept at the gate turn-on voltage. At this point, the first node P1 will be locked at the inactive level by a locking circuit 13 regardless of whether the input circuit 11 receives the active level of the scan trigger signal or not. Therefore, the second node P2 is maintained in a state of not outputting the active level of the scan trigger signal, and an output circuit 14 is maintained in a state of outputting the gate turn-on voltage. Thus, the shift register circuit operating in any state can be switched to the XON working mode of outputting the gate turn-on voltage by the first control signal and the second control signal. When the first control signal and the second control signal are shared among all the shift register circuits, the switching of the XON working mode can be directly realized by the two control signals.

It can be seen that, in the embodiments of the present disclosure, since a plurality of shift register circuits can be controlled to switch to the XON working mode by the two control signals directly, that is, the XON function can be supported, and there is no need to perform the processing such as logical operation on the received control signals, thereby achieving a higher response speed and contributing to the performance improvement of a display product.

Figure 2:
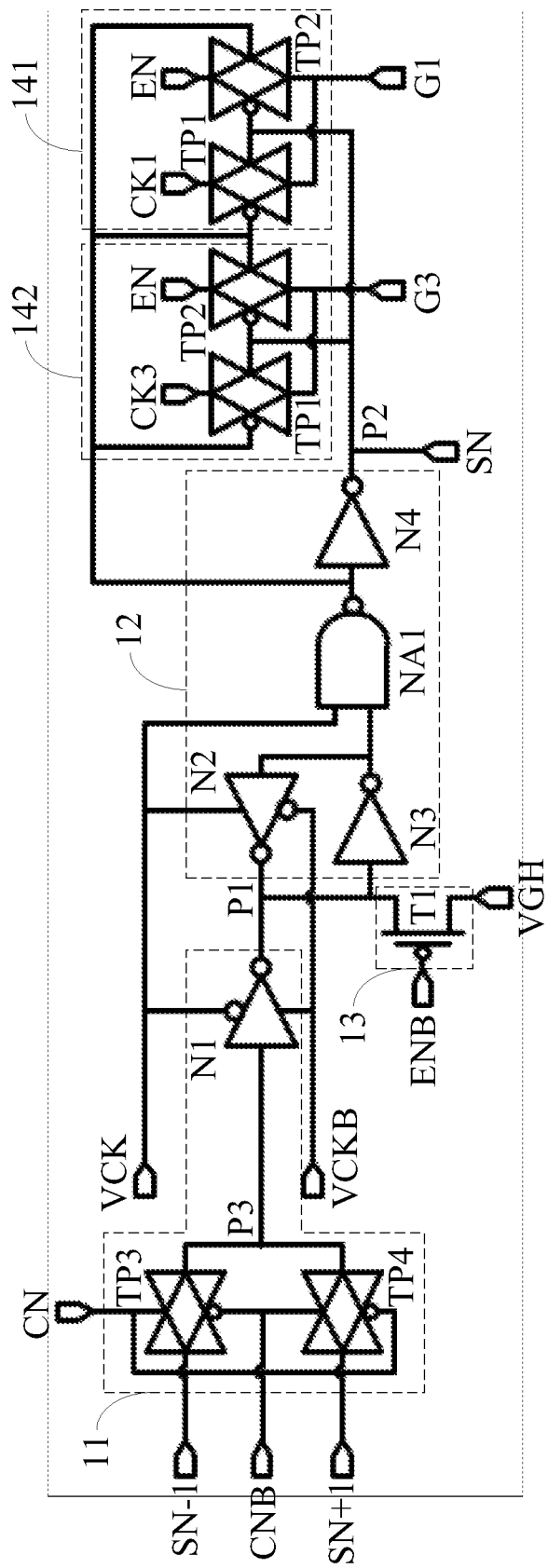
FIG. 2 is a diagram of a circuit structure of a shift register circuit according to an embodiment of the present disclosure.

FIG. 2 is a diagram of a circuit structure of a shift register circuit according to an embodiment of the present disclosure. Referring to FIG. 2, the shift register circuit in the embodiments comprises the input circuit 11, the trigger circuit 12, the locking circuit 13 and the output circuit 14, wherein the output circuit 14 comprises a first output sub-circuit 141 and a second output sub-circuit 142.

The input circuit 11 comprises a third tri-state gate TP3, a fourth tri-state gate TP4, and a first NOT gate N1. Herein, the input end of the third tri-state gate TP3 is connected to a forward scan input end SN−1, the output end thereof is connected to a third node P3, and the positive phase enabling end and the inverting enabling end thereof are connected respectively to a scan direction control signal CN and an inverting scan direction control signal CNB. The input end of the fourth tri-state gate TP4 is connected to a reverse scan input end SN+1, the output end of the fourth tri-state gate TP4 is connected to the third node P3, and the positive phase enabling end and the inverting enabling end thereof are connected respectively to the inverting scan direction control signal CNB and the scan direction control signal CN. The input end of the first NOT gate N1 is connected to the third node P3, the output end thereof is connected to the first node P1, and the positive phase enabling end and the inverting enabling end thereof are connected respectively to a positive phase first clock signal VCK and an inverting first clock signal VCKB.

It should be noted that the tri-state gate is a circuit structure capable of transmitting the signal from the input end to the output end under the control of the signal of a control end. The tri-state gate in the embodiments of the present disclosure may specifically be the circuit structure in which the output end outputs the same level as the input end when the positive phase enabling end is at the high level and the inverting enabling end is at the low level. In other possible implementations, the tri-state gate may have only one of the positive phase enabling end and the inverting enabling end, that is, the output end outputs the same level as the input end when the positive phase enabling end is at the high level and the inverting enabling end is at the low level respectively. For the sake of simple description, herein, the connecting ends configured to control whether the tri-state gates work in the state of transmitting the signals from the input ends to the output ends are collectively referred to as the control ends. The expression like "the control end of the tri-state gate is connected to a certain node or signal" may cover the following possible cases: the positive phase enabling end of the tri-state gate which only has a positive phase enabling end is connected to a certain node or signal with the high level being the active level; the positive phase enabling end of the tri-state gate which only has an inverting enabling end is connected to a certain node or signal with the low level being the active level; the positive phase enabling end and the inverting enabling end of the tri-state gate are connected respectively to a certain signal with the high level being the active level and an inverting signal thereof; and the positive phase enabling end and the inverting enabling end of the tri-state gate are connected respectively to a certain node with the high level being the active level and the node at the level inverted from the certain node. Similarly, the expression like "the enabling end of the NOT gate is connected to a certain node or signal" herein may cover the following possible cases: the positive phase enabling end of the NOT gate which only has the positive phase enabling end is connected to a certain node or signal with the high level being the active level; the positive phase enabling end of the NOT gate which has the inverting enabling end is connected to a certain node or signal with the low level being the active level; the positive phase enabling end and the inverting enabling end of the NOT gate are connected respectively to a certain signal with the high level being the active level and an inverting signal thereof; and the positive phase enabling end and the inverting enabling end of the NOT gate are connected respectively to a certain node with the high level being the active level and a node at a level inverting from the certain node.

The trigger circuit 12 comprises a second NOT gate N2, a third NOT gate N3, an NAND gate NA1, and a fourth NOT gate N4. Herein, the input end of the second NOT gate N2 is connected to a first input end of the NAND gate NA1 (the lower input end of the two input ends on the left of the NAND gate NA1 in FIG. 2), the output end thereof is connected to the first node P1, and the positive phase enabling end and the inverting enabling end thereof are connected respectively to the positive phase first phase clock signal VCK and the inverting first clock signal VCKB. The input end of the third NOT gate N3 is connected to the first node P1, and the output end thereof is connected to the first input end of the NAND gate NA1. A second input end of the NAND gate NA1 is connected to the positive phase first clock signal VCK, and the output end thereof is connected to the input end of the fourth NOT gate N4. The output end of the fourth NOT gate N4 is connected to the second node P2, and the second node P2 is connected to an output end SN of the scan trigger signal.

Figure 5:
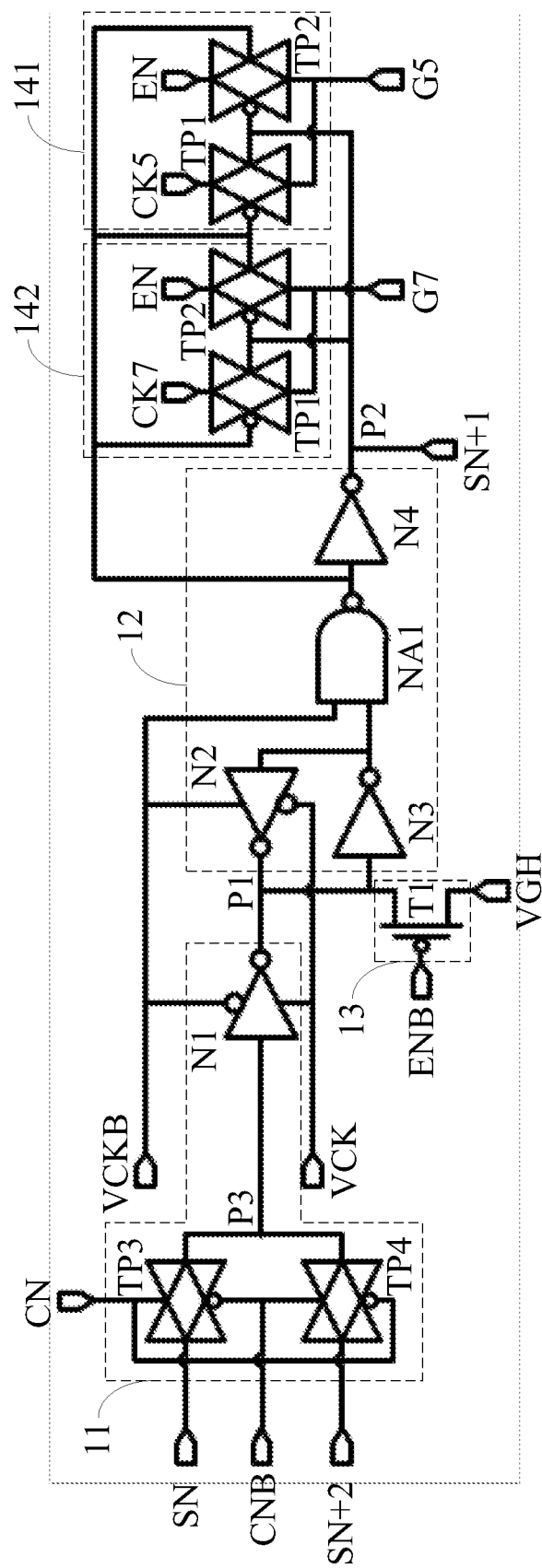
FIG. 5 is a diagram of a circuit connection of a shift register circuit according to an embodiment of the present disclosure.

The locking circuit 13 comprises a first transistor T1. The gate electrode of the first transistor T1 is connected to the first control signal ENB, one of the source electrode and the drain electrode thereof is connected to a first voltage line VGH for providing an inactive level of the first node P1, and the other is connected to the first node P1. In FIG. 5, a P-type thin film transistor is adopted as the above-mentioned first transistor T1, and in other implementations, an N-type transistor may be adopted to accommodate the first control signal ENB with the high level being the active level.

The first output sub-circuit 141 and the second output sub-circuit 142 each comprises a first tri-state gate TP1 and a second tri-state gate TP2. In the first output sub-circuit 141, the input end of the first tri-state gate TP1 is connected to a first sub-clock signal CK1, the output end thereof is connected to a first-level scan output end G1, and the positive phase enabling end and the inverting enabling end thereof are connected respectively to the second node P2 and the node at a level inverting from the second node P2; and the input end of the second tri-state gate TP2 is connected to the second control signal EN, the output end thereof is connected to the first-level scan output end G1, and the positive phase enabling end and the inverting enabling end thereof are connected respectively to the input end of the fourth NOT gate N4 and the second node P2. In the second output sub-circuit 142, the input end of the first tri-state gate TP1 is connected to a third sub-clock signal CK3, the output end thereof is connected to a third-level scan output end G3, and the positive phase enabling end and the inverting enabling end thereof are connected respectively to the second node P2 and the input end of the fourth NOT gate N4; the input end of the second tri-state gate TP2 is connected to the second control signal EN, the output end thereof is connected to the third-level scan output end G3, and the positive phase enabling end and the inverting enabling end thereof are connected respectively to the input end of the fourth NOT gate N4 and the second node P2. Herein, the clock signals connected to the input ends of all first tri-state gates in the shift register circuit are collectively referred to as the second clock signal. In order to achieve the desired circuit timing sequence, the duty cycle of the second clock signal may be set to be less than the duty cycle of the first clock signal.

In the following, in conjunction with the circuit structure shown in FIG. 2, the working principle of the shift register circuit will be described by taking the scan direction control signal CN always being at high level as an example.

Figure 3:
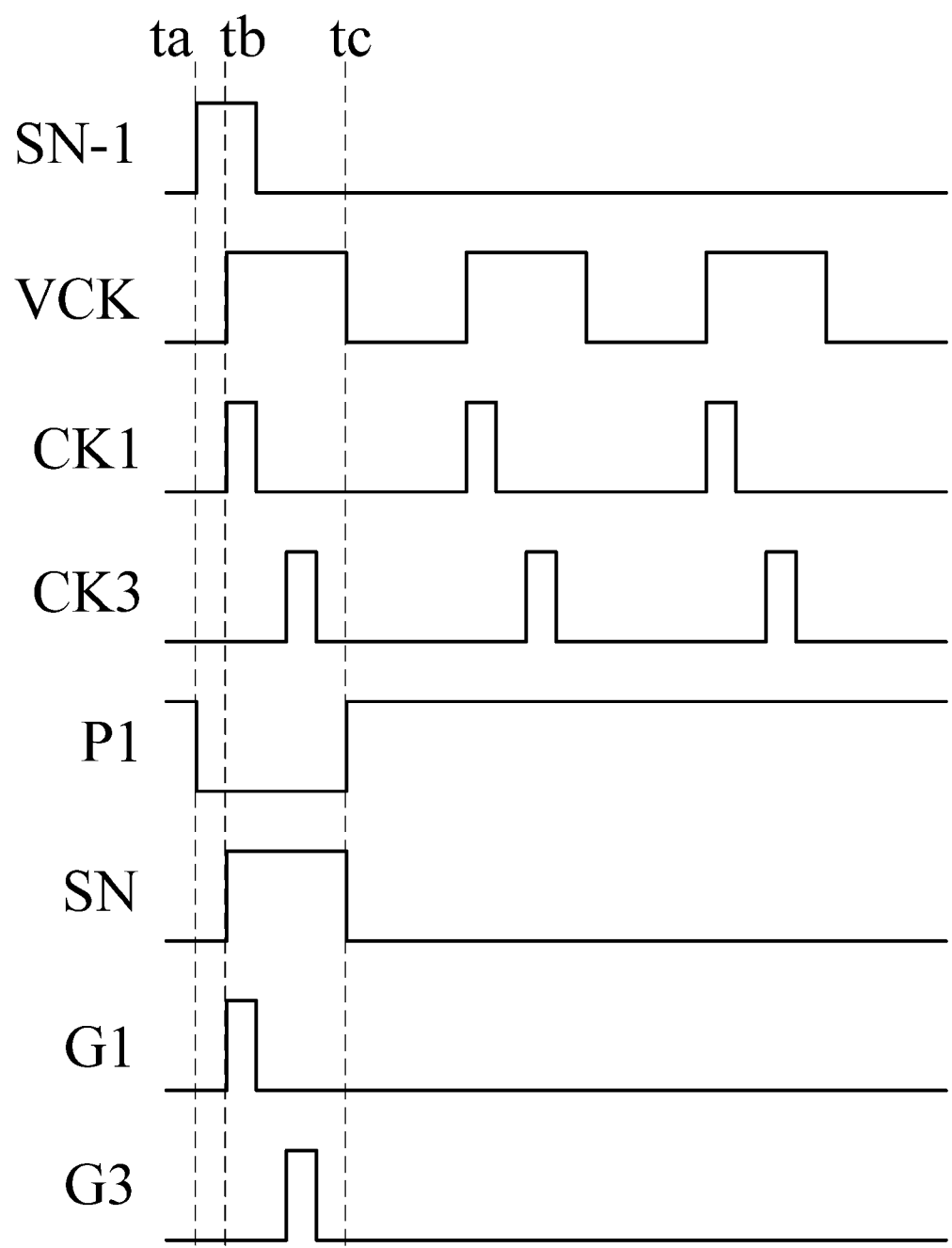
FIG. 3 is a diagram of a circuit timing sequence of the shift register circuit shown in FIG. 2 in a normal working mode.

FIG. 3 is a circuit timing sequence diagram of the shift register circuit shown in FIG. 2 in a normal working mode. Referring to FIGS. 2 and 3, the workflow of the shift register circuit in the normal working mode is as follows.

Before a first moment ta, the forward scan input end SN−1 is at the low level, Regardless of whether the positive phase first clock signal VCK is at the high level or low level, the first node P1 is always kept at the high level, and a phase locker composed of the second NOT gate N2 and the third NOT gate N3 locks the high level of the first node P1, so that the output of the NAND gate NA1 is kept at the high level, and the second node P2 and the output end SN of the scan trigger signal are kept at the low level. Therefore, in each output sub-circuit, the second tri-state gate TP2 is in an enabled state and the first tri-state gate TP1 is in a non-enabled state, and the corresponding scan output ends comprising the first-level scan output end G1 and the third-level scan output end G3 are both kept at the low level.

At the first moment ta, the forward scan input end SN−1 is switched to be at the high level, and at this point, the positive phase first clock signal VCK is at the low level, so that the first NOT gate N1 in the enabled state will switch the first node P1 into the low level, and the third NOT gate N3 will switch the first input end of the NAND gate NA1 to the high level. However, since the positive phase first clock signal VCK is at the low level, the output end of the NAND gate NA1 is still at the high level, and the second node P2 and the output end SN of the scan trigger signal are still kept at the low level. The output states of an output sub-circuit 141 and a second output sub-circuit 142 are kept unchanged.

At a second moment tb, the positive phase first clock signal VCK is switched to be at the high level, the first NOT gate N1 is switched to be at the non-enabled state, and the level of the forward scan input end SN−1 does not affect the level of the first node P1 temporarily. Since both input ends of the NAND gate NA1 are at the high level, the output end of the NAND gate NA1 is switched to be at the low level, so that the second node P2 and the output end SN of the scan trigger signal are switched to be at the high level. Therefore, each output sub-circuit is in the following state: the first tri-state gate TP1 is in the enabled state and the second tri-state gate TP2 is in the non-enabled state, and the corresponding scan output end (the first-level scan output end G1 or the third-level scan output end G3) is switched to be at the high level. Hence, from the second moment tb to a third moment tc, the level of the first-level scan output end G1 is kept consistent with the level of the first sub-clock signal CK1, and the level of the third-level scan output end G3 is kept consistent with the level of the third sub-clock signal CK3. The high level of each sub-clock signal can be configured as a gate turn-on voltage, so as to provide the gate turn-on voltage for each scan output end in a corresponding period.

At the second moment tc, the positive phase first clock signal VCK is switched to be at the low level, the first NOT gate N1 is switched to be at the enabled state, and the forward scan input end SN−1 is at the low level at this point. Therefore, the first node P1 switched to be at the high level under the action of the first NOT gate N1, the output end of the NAND gate NA1 is switched to be at the high level, the second node P2 and the output node SN of the scan trigger signal are switched to be at the low level, and the whole shift register circuit is returned to the state before the moment ta.

It can be seen from the above workflow that the shift register circuit can realize the function of a shift register in the normal working state, that is, the transmission of the active level of the scan trigger signal, and the simultaneous provision of the output of the multi-level scan output ends. Compared with the shift register circuit which can only provide the one-level scan output end, the above implementation can simplify the circuit structure of the scan driving circuit and reduce the area occupied by a formed GOA circuit on the display panel, which is favorable to achieve the narrower border of a display screen.

Figure 4:
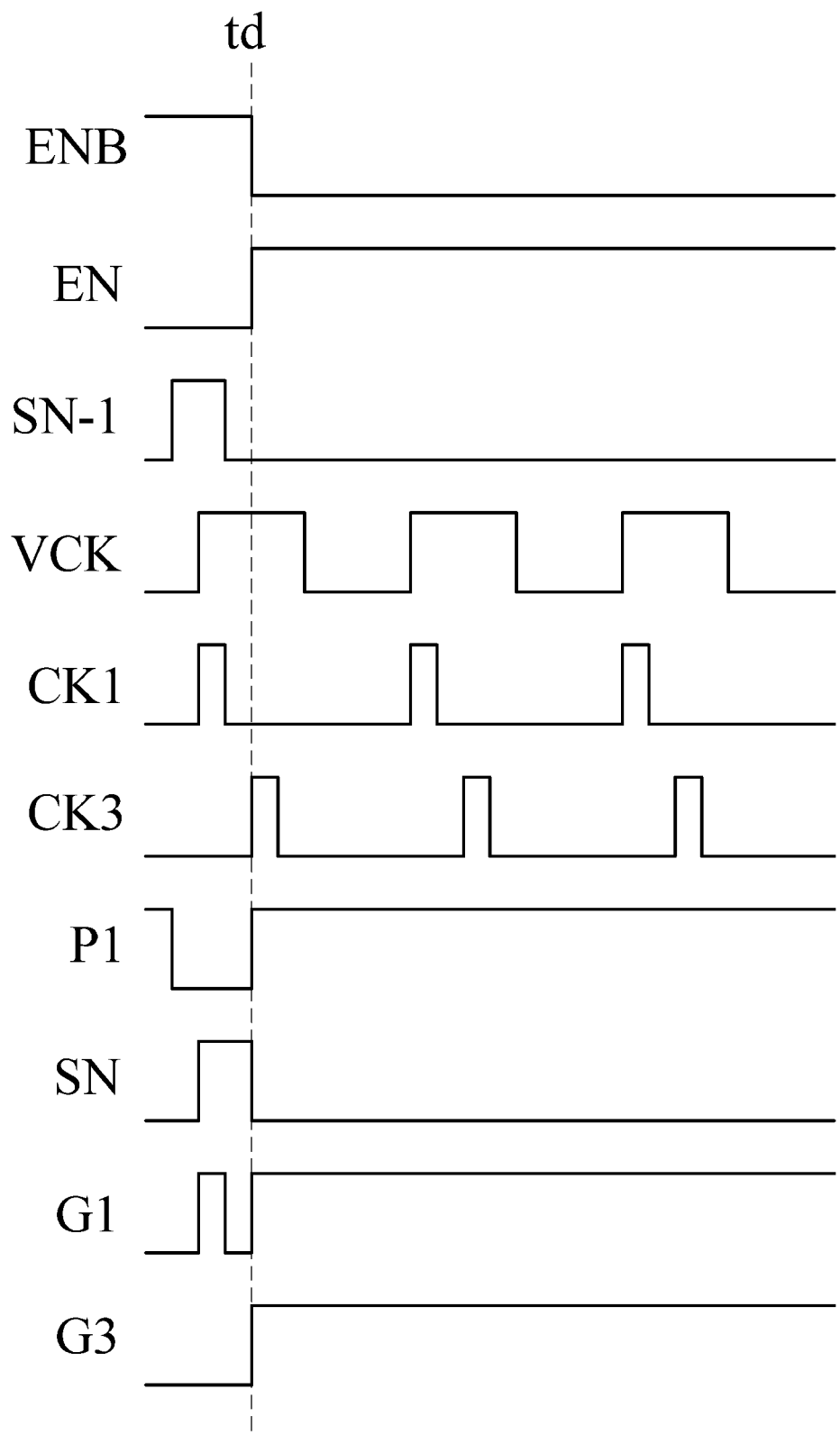
FIG. 4 is a diagram of a circuit timing sequence of the shift register circuit shown in FIG. 2 when switched to an XON working mode.

FIG. 4 is a diagram of a circuit timing sequence of the shift register circuit shown in FIG. 2 when switched to the XON working mode. Referring to FIG. 4, the shift register circuit is switched to the XON working mode at a fourth moment td, that is, the shift register circuit is in the normal working mode before the fourth moment td, and the workflow is as described above.

At the fourth moment td, the first control signal ENB is switched from the high level of the inactive level to the low level of the active level, and the second control signal EN is switched at the scan output end from the low level of the inactive level to the gate turn-on voltage of the active level. Therefore, the first node P1 is forcibly switched to be at the high level under the action of the first transistor T1, then the output of the NAND gate is correspondingly switched to be at the high level, and the second node P2 and the output end SN of the scan trigger signal are correspondingly switched to be at the low level. Therefore, the second tri-state gate TP2 in each output sub-circuit is in the enabled state, and the first tri-state gate TP1 in each output sub-circuit is in the non-enabled state. Hence, the second control signal EN is connected to all scan output ends, such that all scan output ends output the gate turn-on voltage.

It can be seen from the above workflow that even if the shift register circuit is at a moment of outputting the active level of the scan trigger signal or the gate turn-on voltage, the switching of the XON working mode can still be fast completed by controlling the first control signal ENB and the second control signal EN. In an example, the first control signal ENB is generated by the second control signal EN through the circuit structure such as an inverter, thereby reducing the number of external connecting ends of the shift register circuit.

FIG. 5 is a diagram of a circuit connection of a shift register circuit according to an embodiment of the present disclosure. The shift register circuit can be cascaded with the shift register circuit shown in FIG. 2 to form at least part of a scan driving circuit capable of providing the output for four consecutive odd-numbered-level scan output ends. Referring to FIG. 5, the shift register circuit according to the present embodiment has the totally same internal configuration as the shift register circuit shown in FIG. 2, but differs only in the manner of circuit connection. For the convenience of description, the shift register circuit shown in FIG. 2 is referred to as an upper-level shift register circuit, and the shift register circuit shown in FIG. 5 is referred to as a lower-level shift register circuit. Compared with the upper-level shift register circuit:

The connecting position of the positive phase first clock signal VCK and the connecting position of the inverting first clock signal VCKB in the lower-level shift register circuit are exchanged. The second clock signals connected to the two output sub-circuits are respectively turned to a fifth sub-clock signal CK5 and a seventh sub-clock signal CK7. The scan output ends connected to the two output sub-circuits are correspondingly turned to a fifth-level scan output end G5 and a seventh-level scan output end G7. The forward scan input end of the lower-level shift register circuit is connected to the output end SN of the scan trigger signal of the upper-level shift register circuit. In addition, the output end of the scan trigger signal of the lower-level shift register circuit is connected to the reverse scan input end SN+1 of the upper-level shift register circuit. Herein, the lower-level shift register circuit has a reverse scan input end SN+2.

Figure 6:
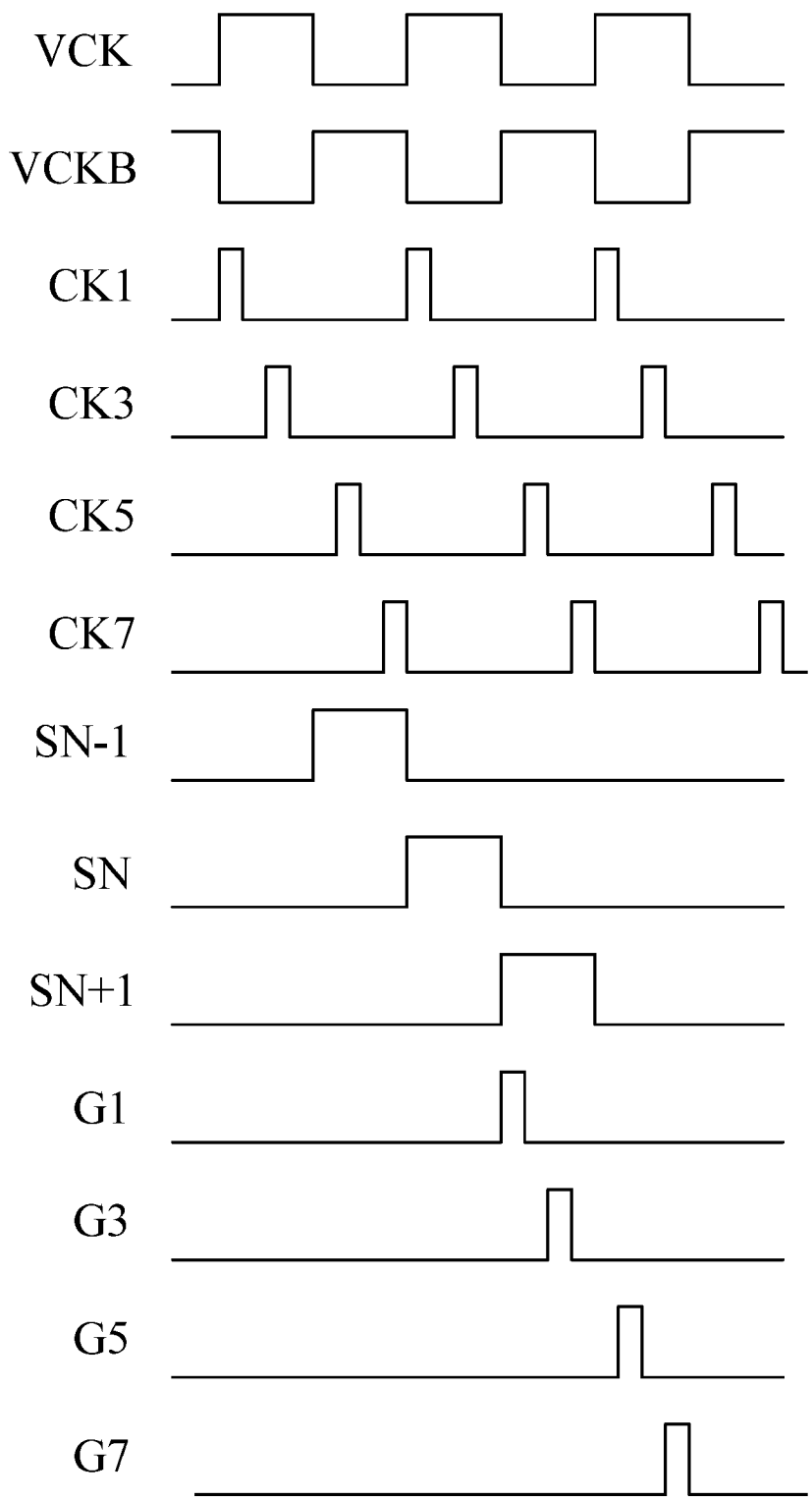
FIG. 6 is a diagram of a circuit timing sequence of a circuit structure composed of two shift register circuits according to an embodiment of the present disclosure.

Based on the above connecting relationship, FIG. 6 is a diagram of a circuit timing sequence of a circuit structure composed of two shift register circuits. Referring to FIGS. 5 and 6, for the lower-level shift register circuit, the high level of the forward scan input end SN coincides with a low level period of the inverting first clock signal VCKB. Therefore, at the beginning of the period, the first NOT gate N1 is in the enabled state, and thus the working state of the shift register circuit is consistent with the working state of the shift register circuit between the first moment to and the second moment tb. When the inverting first clock signal VCKB is turned from the low level to the high level, the working state of the shift register circuit will be consistent with the working state at the beginning of the second moment tb again. Therefore, the lower-level shift register circuit can output the scan trigger signal received at the forward scan input end SN after half a clock cycle of the first clock signal, and respectively output the same level as the fifth sub-clock signal CK5 at the fifth-level scan output end G5 and the same level as the seventh sub-clock signal CK7 at the seventh-level scan output end G7 during the period in which the scan trigger signal is output.

Referring to FIG. 3 and FIG. 6, it can be seen that the waveform at the positive phase scan input end SN−1 of the upper-level shift register circuit is changed, but compared with the working process of the lower-level shift register circuit, it is known that the upper-level shift register circuit can still output the scan trigger signal and the gate turn-on voltage according to the waveform shown in FIG. 3. Thus it can be seen that the scan trigger signal capable of playing a role of triggering is not limited to one form.

From FIG. 6, it can be seen that the two shift register circuits that are cascaded with each other can realize the output function of consecutive four odd-numbered-level scan output ends or consecutive four even-numbered-level scan output ends of the scan driving circuit. Referring to the above cascading mode and circuit timing sequence, the circuit structure having the output function of any multi-level scan output ends of the scan driving circuit can also be implemented.

Figure 7:
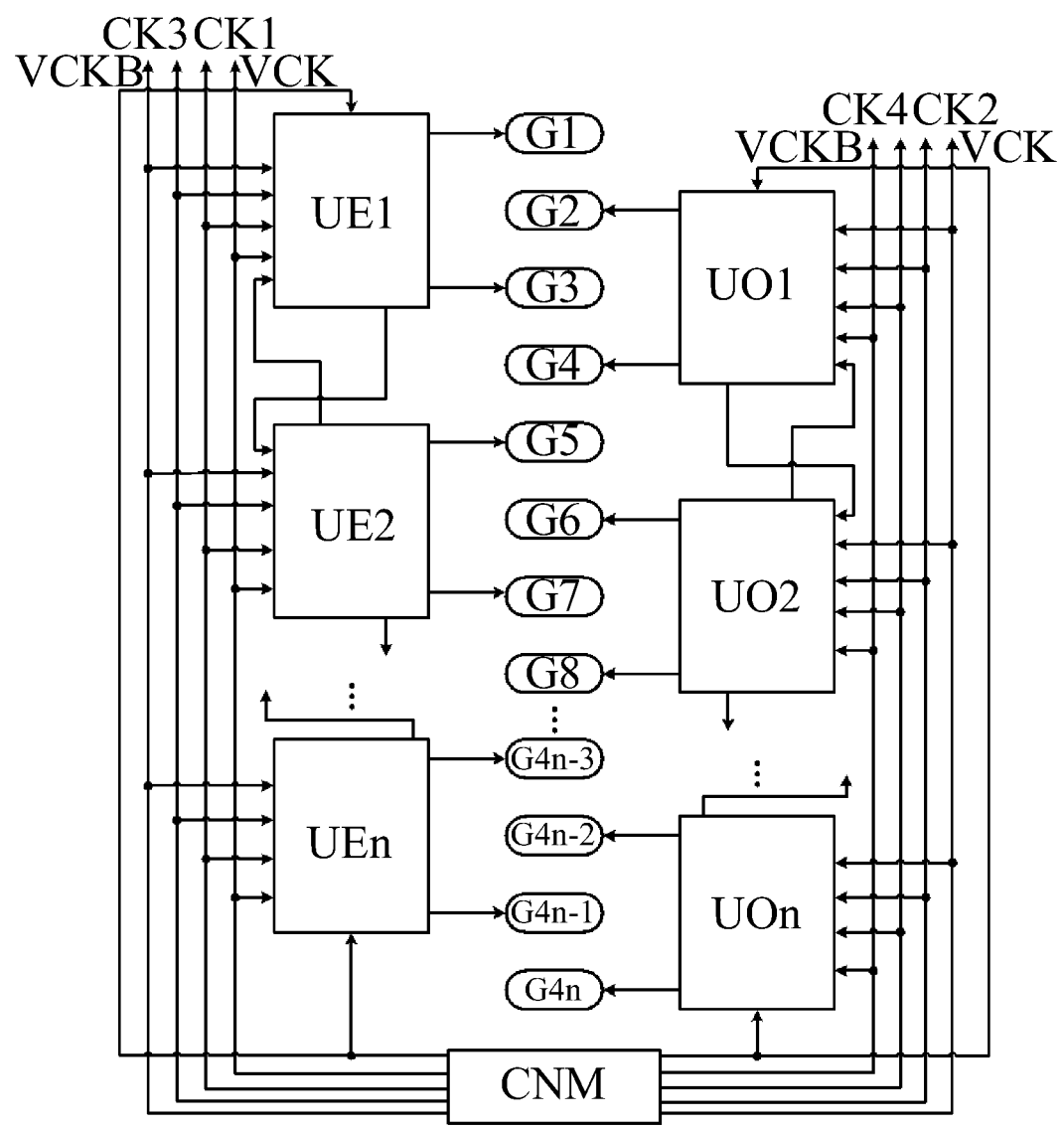
FIG. 7 is a block diagram of a structure of a scan driving circuit according to an embodiment of the present disclosure.
Figure 8:
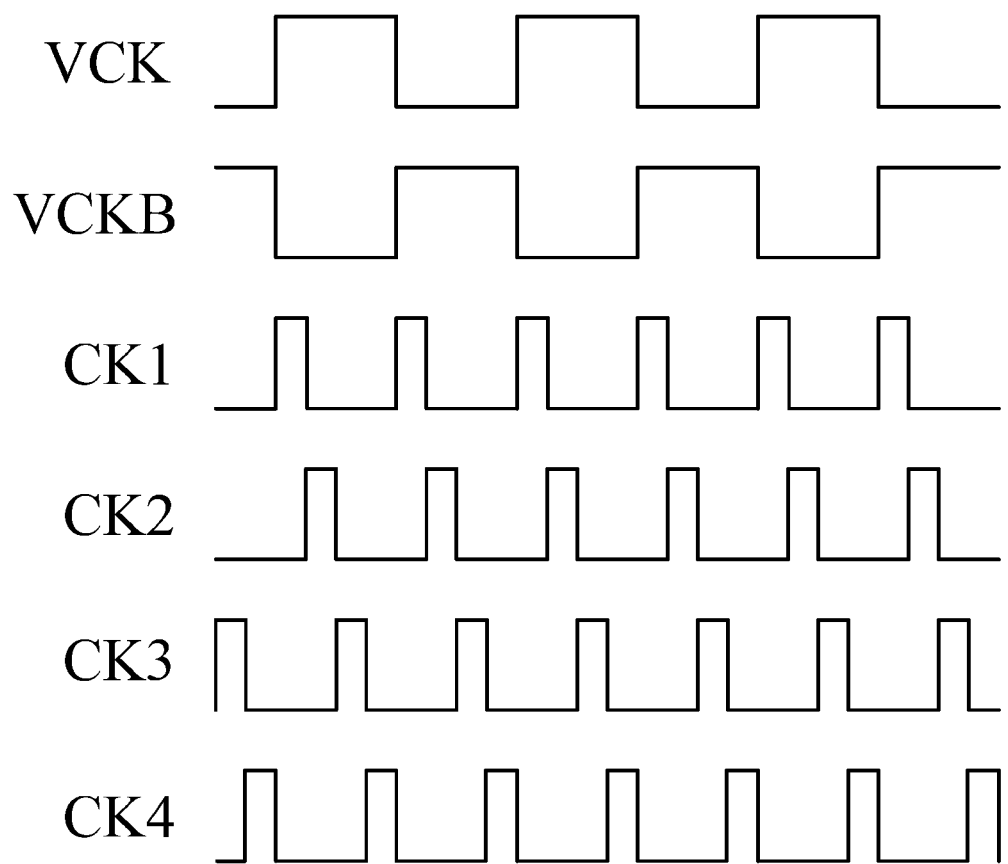
FIG. 8 is a diagram of a timing sequence of a driving signal of the scan driving circuit shown in FIG. 7.

FIG. 7 is a block diagram of a structure of a scan driving circuit according to an embodiment of the present disclosure, and FIG. 8 is a diagram of a timing sequence of corresponding driving signals. Referring to FIG. 7 and FIG. 8, the scan driving circuit comprises n odd-numbered-level shift register circuits UE1, UE2, . . . , UEn, n even-numbered-level shift register circuits UO1, UO2, . . . , UOn (n is a positive integer), and a driving signal transmitting circuit CNM. Every two odd-numbered-level shift register circuits and every two even-numbered-level shift register circuits are connected according to a cascading manner between the two shift register circuits shown in FIGS. 2 and 5. The driving signal transmitting circuit CNM transmits the driving signals to each level shift register circuit, wherein the driving signals comprise a positive phase first clock signal VCK, an inverting first clock signal VCKB, a first sub-clock signal CK1, a second sub-clock signal CK2, a third sub-clock signal CK3, and a fourth sub-clock signal CK4, and the specific timing sequence is as shown in FIG. 8. It can be understood that the first sub-clock signal CK1 and the fifth sub-clock signal CK5 shown in FIG. 6 are replaced by the first sub-clock signal CK1 shown in FIG. 8, the third sub-clock signal CK3 and the seventh sub-clock signal CK7 shown in FIG. 6 are replaced by the third sub-clock signal CK3 and shown in FIG. 8, and then the above two shift register circuits which are cascaded with each other can achieve the same output timing sequence as in FIG. 6. Thus, the n odd-numbered-level shift register circuits UE1, UE2, . . . , UEn can provide output signals for all odd-numbered-level scan output ends G1, G3, G5, G7, . . . , G4n-3 and G4n-1, and the n even-numbered-level shift register circuits UO1, UO2, . . . , UOn can provide output signals for all even-numbered-level scan output ends G2, G4, G6, G8, . . . , G4n-2 and G4n, so that the scan driving circuit can output the gate turn-on voltage level by level at the consecutive 4n-level scan output ends to achieve the desired output function.

It can be seen that, compared to the implementation of providing the signal output of the 4n-level scan output ends by using the 4n-level shift register circuits, the embodiments of the present disclosure can reduce the shift register circuits by half. Therefore, it is favorable to greatly simplify the circuit structure of the scan driving circuit, save the layout space, and narrow the display border.

Figure 9:
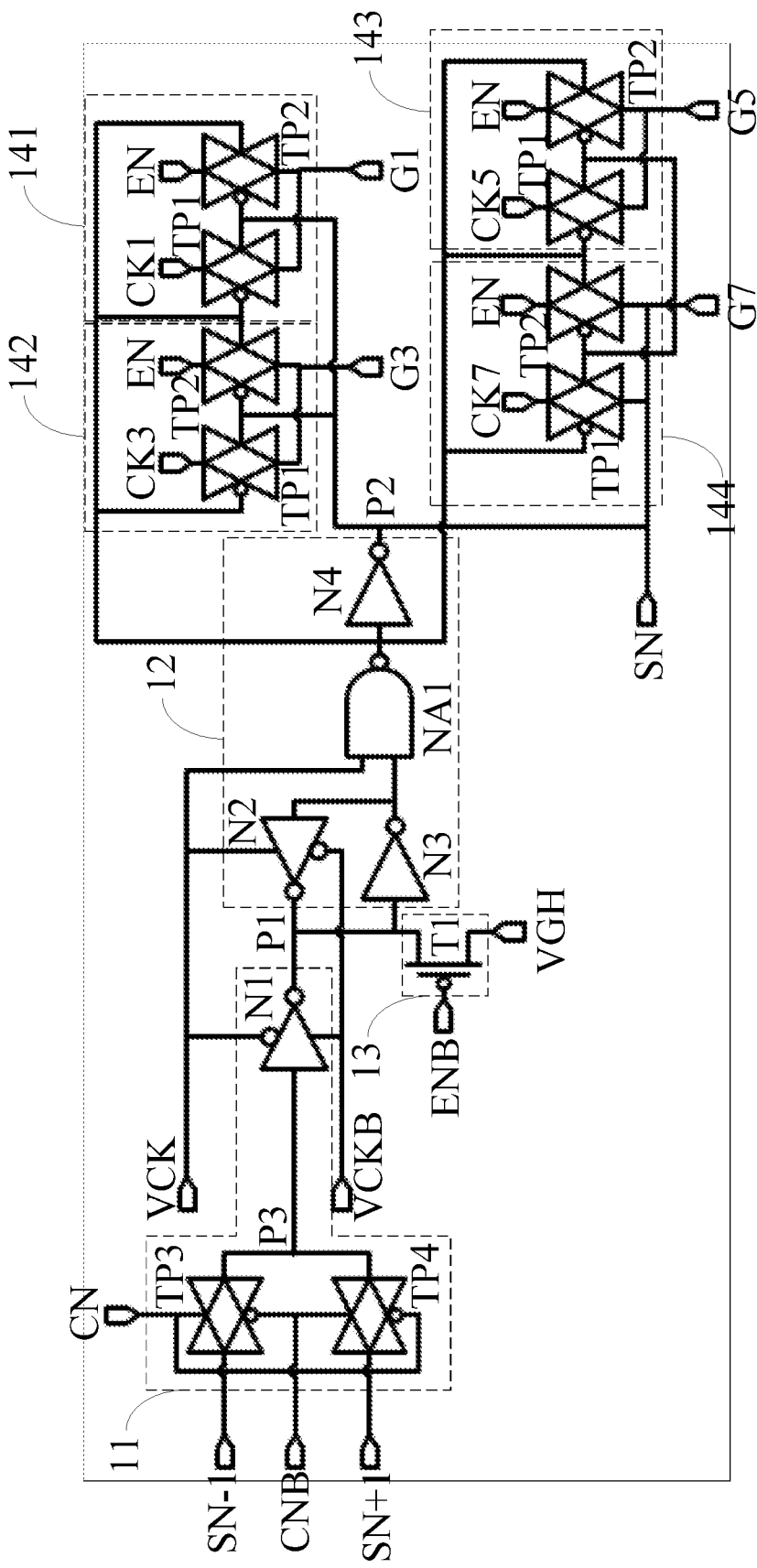
FIG. 9 is a diagram of a circuit structure of a shift register circuit according to another embodiment of the present disclosure.
Figure 10:
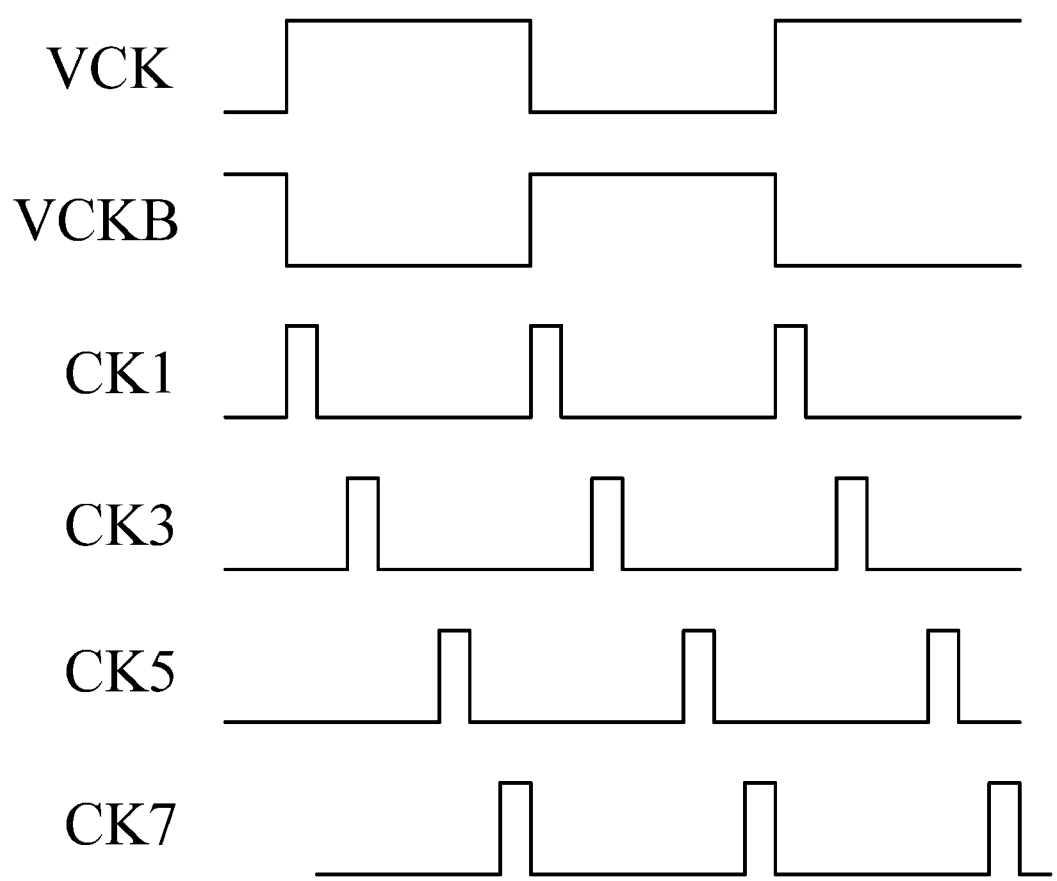
FIG. 10 is a diagram of a timing sequence of a driving signal of the shift register circuit shown in FIG. 9.

FIG. 9 is a diagram of a circuit structure of a shift register circuit according to another embodiment of the present disclosure, and FIG. 10 is a diagram of a timing sequence of corresponding driving signals thereof. Referring to FIG. 9, compared with the shift register circuit shown in FIG. 2, the output circuit of the shift register circuit shown in FIG. 9 comprises four output sub-circuits, namely, a first output sub-circuit 141, a second output sub-circuit 142, a third output sub-circuit 143 and a fourth output sub-circuit 144. The input ends of the first tri-state gates TP1 in the four output sub-circuits are connected respectively to the first sub-clock signal CK1, the third sub-clock signal CK3, the fifth sub-clock signal CK5, and the seventh sub-clock signal CK7. The output ends of all tri-state gates in the four output sub-circuits are connected respectively to the first-level scan output end G1, the third-level scan output end G3, the fifth-level scan output end G5, and the seventh-level scan output end G7. Thus, in accordance with the driving timing sequence shown in FIG. 10, with reference to the working principle described above, it can be inferred that the shift register circuit shown in FIG. 9 can provide an output signal for the consecutive four odd-numbered-level scan output ends.

By taking the shift register circuit shown in FIG. 2 and FIG. 9 as an example, the number of the output sub-circuits included in the output circuit of one shift register circuit can be selected according to a required application scenario, for example, 2, 3, 4, 6, 8, etc., and the required output can be achieved with reference to the timing sequence described above.

Figure 11:
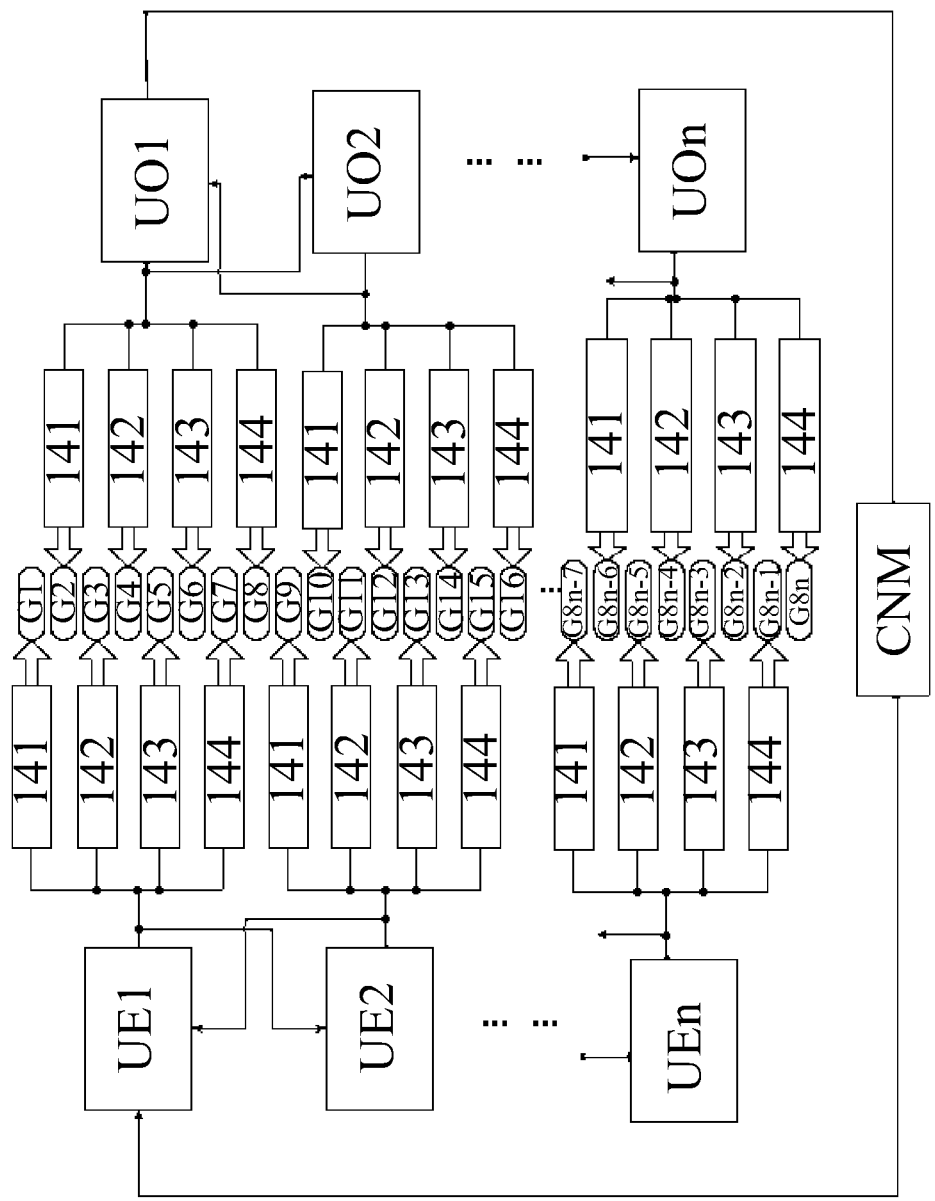
FIG. 11 is a block diagram of a structure of a scan driving circuit according to another embodiment of the present disclosure.

FIG. 11 is a block diagram of a structure of a scan driving circuit according to yet another embodiment of the present disclosure. In this scan driving circuit, compared with the circuit structure shown in FIG. 7, for example, the shift register circuit capable of providing the scan signal for the two-level scan output ends as shown in FIG. 2 is replaced by, for example, the shift register circuit capable of providing the scan signal for four-level scan output ends as shown in FIG. 9. It can be inferred that the n odd-numbered-level shift register circuits UE1, UE2, . . . , UEn in the scan driving circuit can provide output signals for all odd-numbered-level scan output ends G1, G3, G5, G7, G9, G11, G13., G15, . . . , G8n-7, G8n-5, G8n-3 and G8n-1, and the n even-numbered-level shift register circuits UO1, UO2, . . . , UOn can provide output signals for all even-numbered-level scan output ends G2, G4, G6, G8, G10, G12, G14, G16, . . . , G8n-6, G8n-4, G8n-2 and G8n, so that the scan driving circuit can output the gate turn-on voltage level by level at the consecutive 8n-level scanning output ends, thereby realizing the desired output function.

Figure 12:
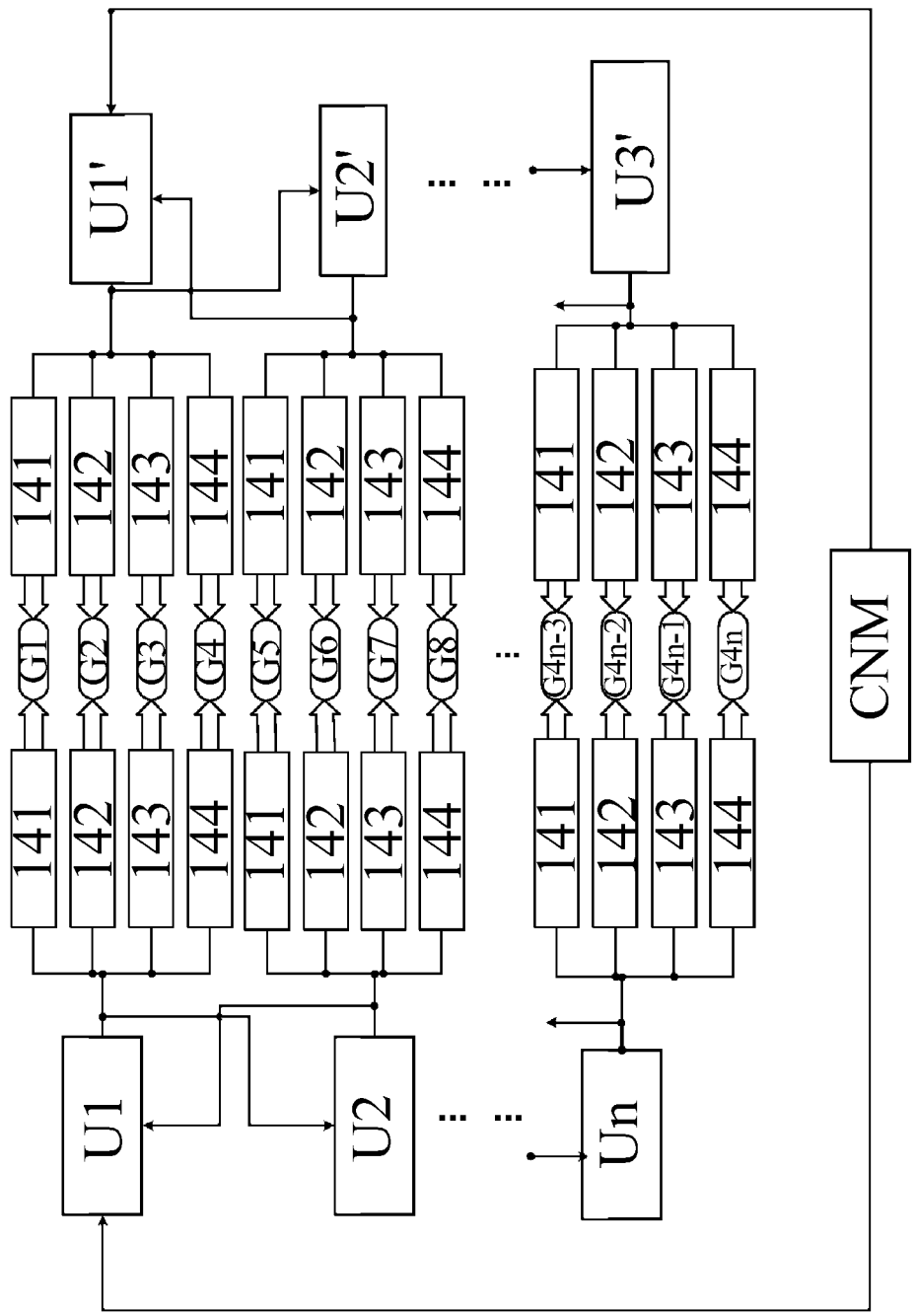
FIG. 12 is a block diagram of a structure of a scan driving circuit according to another embodiment of the present disclosure.

FIG. 12 is a block diagram of a structure of a scan driving circuit according to still another embodiment of the present disclosure. The driving circuit has n shift register circuits U1, U2, . . . , Un disposed on the left side and n shift register circuits U1', U2', . . . , Un' disposed on the right side, as well as the driving signal transmitting circuit CNM. Every two odd-numbered-level shift register circuits and every two even-numbered-level shift register circuits are connected according to the cascading manner between the two shift register circuits shown in FIGS. 2 and 5. The driving signal transmitting circuit CNM transmits the driving signals to each level shift register circuit, wherein the variety and timing sequence of the driving signals can use the situation as shown in FIG. 8. It can be understood that in the scan driving circuit according to the embodiments of the present disclosure, the n shift register circuits U1, U2, . . . , Un disposed on the left side can provide output signals for all-level scan output ends G1, G2, G3, G4, G5, G6, G7, G8, . . . , G4n-3, G4n-2, G4n-1 and G4n, and then shift register circuits U1', U2', . . . , Un' disposed on the right side can provide the same output signals for all-level scan output ends G1, G2, G3, G4, G5, G6, G7, G8, . . . , G4n-3, G4n-2, G4n-1 and G4n, so that the scan driving circuit can output the gate turn-on voltage level by level in the form of bilateral driving at consecutive 4n-level scan output ends to realize the desired output function.

It should be noted that the above workflow is described by taking the case where the scan direction control signal CN is at the high level as an example. When the scan direction control signal CN is at the low level, the third tri-state gate TP3 in the input circuit 11 will be in the non-enabled state and the fourth tri-state gate TP4 will be in the enabled state. Therefore, the functions of the forward scan input end and the reverse scan input end will be exchanged with each other, so that the reverse scan working mode of upwardly outputting the gate turn-on voltage level by level from the last level can be realized.

According to the same inventive concept, there is provided a display device in embodiments of the present disclosure. The display device comprises any above scan driving circuit. The display device in the embodiments of the present disclosure may be any product or component having a display function, such as a display panel, a mobile phone, a tablet computer, a television, a display, a notebook computer, a digital photo frame and a navigator. The display device can also achieve the same or corresponding beneficial effects based on the beneficial effects that the scan driving circuit can achieve.

Based on the same inventive concept, there is provided a driving method for a scan driving circuit in embodiments of the present disclosure. The scan driving circuit comprises at least one of any one of above shift register circuits and the method comprises the following steps.

The first control signal is switched to be at the active level, and the second control signal is switched to be at the gate turn-on voltage, such that each shift register circuit in the scan driving circuit outputs the gate turn-on voltage.

It should be understood that the working process of any one of above shift register circuits upon switching to the XON working mode can be regarded as an implementation example of the above driving method. Therefore, the examples of specific process of the above respective steps can refer to the above and will not be repeated here.

It can be seen that in the shift register circuit, the first level is locked as the inactive level when the first control signal is at the active level, such that no active level of the scan trigger signal is output at the second node. At this point, the shift register circuit can output the gate turn-on voltage by causing the second control signal to output the gate turn-on voltage. When the first control signal and the second control signal are shared between all the circuits, the switching of the XON working mode can be directly realized by the two control signals. Since there is no need to perform the processing such as logic operation on the control signals, a higher response speed can be achieved, which is favorable to improve the performances of the display product.

The foregoing is only exemplary embodiments of the present disclosure, and is not intended to limit the disclosure. Any modifications, equivalents, improvements and the like made within the spirit and principle of the present disclosure should be included within the protection scope defined by the appended claims of the present disclosure.

What is claimed is:

1. A method for driving a scan driving circuit, wherein the scan driving circuit comprises a plurality of shift register circuits, and each of the shift register circuits comprises:
    an input circuit connected to a first node and configured to provide, upon receiving an active level of a scan trigger signal, the active level for the first node;
    a trigger circuit, connected respectively to the first node and a second node, and configured to provide the active level of the scan trigger signal for the second node when the first node is at the active level and a first clock signal is at a first level;
    a locking circuit connected to the first node and configured to lock a level of the first node as an inactive level when a first control signal is at the active level; and
    an output circuit connected to the second node and configured to output a gate turn-on voltage during a period in which the second node is at an active level of the scan trigger signal, and output a voltage same as a voltage of a second control signal during other periods other than the period;
    and the method comprises:
    switching the first control signal to an active level, and switching the second control signal to the gate turn-on voltage, to cause each of the shift register circuits in the scan driving circuit to output the gate turn-on voltage.

2. The method according to claim 1, wherein the output circuit comprises at least two output sub-circuits,
    the at least two output sub-circuits are both connected to the second node, each of the output sub-circuits is connected to a second clock signal, a duty cycle of the second clock signal is less than a duty cycle of the first clock signal, each of the output sub-circuits is connected to one of at least two scan output ends, and the output sub-circuit is configured to provide a level same as the level of the second clock signal connected thereto for the scan output end connected thereto during a period in which the second node is at the active level of the scan trigger signal, and provide a voltage same as the voltage of the second control signal for the scan output end connected thereto during other periods other than the period.

3. The method according to claim 2, wherein the output sub-circuit comprises a first tri-state gate and a second tri-state gate, an input end of the first tri-state gate is connected to the second clock signal corresponding thereto, an output end thereof is connected to the scan output end corresponding thereto, and a control end thereof is connected to the second node, and an input end of the second tri-state gate is connected to the second control signal, an output end thereof is connected to the scan output end corresponding thereto, and a control end thereof is connected to the second node.

4. The method according to claim 1, wherein the locking circuit comprises a first transistor, a gate electrode of the first transistor is connected to the first control signal, one of a source electrode and a drain electrode thereof is connected to a first voltage line for providing an inactive level of the first node, and the other is connected to the first node.

5. The method according to claim 1, wherein the input circuit comprises a third tri-state gate and a fourth tri-state gate, an input end of the third tri-state gate is connected to a forward scan input end, an output end thereof is connected to a third node, and a control end thereof is connected to a scan direction control signal, and an input end of the fourth tri-state gate is connected to a reverse scan input end, an output end thereof is connected to the third node, and a control end thereof is connected to the scan direction control signal.

6. The method according to claim 5, wherein the input circuit further comprises a first NOT gate, an input end of the first NOT gate is connected to the third node, an output end thereof is connected to the first node, and an enabling end thereof is connected to the first dock signal, and the first level of the first clock signal is a level causing the first NOT gate to be in a nonworking state.

7. The method according to claim 1, wherein the trigger circuit comprises a second NOT gate, a third NOT gate, a NAND gate, and a fourth NOT gate, an input end of the second NOT gate is connected to a first input end of the NAND gate, an output end thereof is connected to the first node, and an enabling end thereof is connected to the first clock signal, the first level of the first clock signal is a high level, and the second NOT gate is in a working state when the enabling end is at a high level, an input end of the third NOT gate is connected to the first node, and an output end thereof is connected to the first input end of the NAND gate, a second input end of the NAND gate is connected to the first clock signal, an output end thereof is connected to an input end of the fourth NOT gate, and an output end of the fourth NOT gate is connected to the second node.

* * * * *